(12) United States Patent
Tang

(10) Patent No.: US 7,904,840 B2
(45) Date of Patent: *Mar. 8, 2011

(54) METHOD AND SYSTEM TO REDISTRIBUTE WHITE SPACE FOR MINIMIZING WIRE LENGTH

(75) Inventor: Xiaoping Tang, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 531 days.

This patent is subject to a terminal disclaimer.

(21) Appl. No.: 11/925,238

(22) Filed: Oct. 26, 2007

(65) Prior Publication Data

US 2008/0046854 A1 Feb. 21, 2008

Related U.S. Application Data

(63) Continuation of application No. 11/034,098, filed on Jan. 12, 2005, now Pat. No. 7,305,641.

(51) Int. Cl.
*G06F 17/50* (2006.01)
(52) U.S. Cl. ............. 716/2; 716/1; 716/3; 716/8; 716/9; 716/10; 716/11; 716/14
(58) Field of Classification Search ................ 716/1–3, 716/8–14
See application file for complete search history.

(56) References Cited

U.S. PATENT DOCUMENTS

| | | | | |
|---|---|---|---|---|
| 5,663,891 A | * | 9/1997 | Bamji et al. ...................... | 716/2 |
| 5,689,433 A | * | 11/1997 | Edwards ........................... | 716/2 |
| 6,898,769 B2 | * | 5/2005 | Nassif et al. ...................... | 716/5 |
| 7,062,747 B2 | * | 6/2006 | Horie et al. ...................... | 716/19 |
| 7,089,521 B2 | * | 8/2006 | Kurzum et al. .................. | 716/10 |
| 2005/0166169 A1 | | 7/2005 | Kurzum et al. | |
| 2005/0278676 A1 | | 12/2005 | Dhanwada et al. | |

OTHER PUBLICATIONS

Tang, et al., Optimal Redistribution of White Space for Wire Length Minimization, 2005, IEEE/ACM, pp. 412-417.
Yang, et al., Routability Driven White Space Allocation for Fixed-die Standard-Cell Placement, Apr. 2002, ACM, pp. 42-47;.
Bamji, et al., Enhance Network Flow Algorithm for Yield Optimization, 1996, ACM, pp. 746-751; and.
Tang, et al., FAST-SP: A fast Algorithm for Block Placement Based on Sequence Pair, 2001, IEEE, pp. 521-526.

* cited by examiner

*Primary Examiner* — Nghia M Doan
(74) *Attorney, Agent, or Firm* — Scully, Scott, Murphy & Presser, P.C.; Brian Verminski, Esq.

(57) ABSTRACT

Disclosed are a method and a system for redistributing white space on an integrated circuit. The method comprises the steps of providing a series of circuit blocks for the integrated circuit, and placing the blocks on the integrated circuit to obtain a predefined optimal wire length. In accordance with the preferred embodiment of the invention, we first show that the problem of placing the blocks to obtain an optimal wire length, can be formulated as linear programming. Then, we find it can be solved by efficient min-cost flow implementation instead of general and slow linear programming. The approach guarantees to obtain the minimum total wire length for a given floorplan topology. We also show that the approach is capable of handling various constraints such as fixed-frame (fixed area), IO pins, pre-placed blocks, boundary blocks, range placement, alignment and abutment, rectilinear blocks, cluster placement, and bounded net delay, without loss of optimality.

14 Claims, 6 Drawing Sheets

, N_n\}$ where $N_i$, i=1, 2, … , n describes the connection between blocks, find a placement of blocks B satisfying the topological relation imposed by the sequence pair, such that the total wire length

METHOD AND SYSTEM TO REDISTRIBUTE WHITE SPACE FOR MINIMIZING WIRE LENGTH

RELATED APPLICATIONS

This application is a continuation application of U.S. patent application Ser. No. 11/034,098, filed Jan. 12, 2005, now U.S. Pat. No. 7,305,641.

BACKGROUND OF THE INVENTION

1. Field of the Invention

This invention generally relates to floorplanning. More specifically, the invention relates to a method and system to decide the positions of circuit blocks or IP blocks on an integrated circuit in order to obtain an optimal wire length.

2. Background Art

Floorplanning is to decide the positions of circuit blocks or IP blocks on a chip subject to various objectives. It is the early stage of physical design and determines the overall chip performance. Due to the enormous complexity of VLSI design with continuous scaling-down of technology, a hierarchical approach is needed for the circuit design in order to reduce runtime and improve solution quality. Also, IP (module reuse) based design methodology becomes widely adopted. This trend makes floorplanning even more important.

Floorplanning can be classified into two categories, slicing and non-slicing. Among slicing representations, there are binary tree and normalized Polish expression. For non-slicing structure, many representations are invented recently, such as topology representation (BSG, sequence pair, TCG), packing representation (O-tree, B*-tree), and mosaic representation (CBL, Q-sequence, twin binary tree, twin binary sequence). All of these algorithms compact blocks to the left and bottom subject to the given topological constraints. Recently, additional constraints are addressed in floorplanning, such as fixed frame, alignment and performance (bounded net delay), buffer planning in floorplanning, etc. Again, within the approaches, the floorplan is compacted to lower-left (or upper-right) corner and then evaluated. In general, compaction implies minimum area. However, it may be sub-optimal for other objectives, such as minimizing wire length, routing congestion, and buffer allocation. As we can see, even with the same minimum area and the same topology, there exists lots of different floorplans that have different distribution of white space and thus have different values on other objectives.

In floorplanning and placements minimizing total wire length is the first-order objective. If a floorplanner/placer can minimize total wire length very well, then there is much freedom and space to consider and tradeoff other concerns such as routability and timing. It is not known in the prior art how to place blocks to obtain an optimal wire length.

SUMMARY OF THE INVENTION

An object of this invention is to provide an improved floorplanning procedure to determine the positions of circuit blocks or IP blocks on a chip substrate.

Another object of the present invention is to minimize total wire length in floorplanning.

A further object of the invention is to solve the following problem:

Given a sequence pair (X, Y) with a set of m macro blocks $B=\{b_1, b_2, \ldots, b_m\}$ where $w_i \times h_i$ specifies the dimension of block $b_i$ ($w_i$: width, $h_i$: height), and a set of nets $N=\{N_1, N_2, \ldots , N_n\}$ where $N_i$, i=1, 2, … , n describes the connection between blocks, find a placement of blocks B satisfying the topological relation imposed by the sequence pair, such that the total wire length $$\sum_{i=1}^{n} \lambda_i W(N_i)$$

is minimized where $W(N_i)$ denotes the wire length of net $N_i$ and $\lambda_i$ is its weight.

Another object of the invention is to use a min-cost flow based approach to determine where to place circuit blocks in an integrated circuit, in order to minimize total wire length.

These and other objectives are attained with a method and system for redistributing white space on an integrated circuit. The method comprises the steps of providing a series of circuit blocks for the integrated circuit, and placing the blocks on the integrated circuit to obtain a predefined optimal wire length.

In accordance with the preferred embodiment of the invention, we first show that the problem of placing the blocks to obtain an optimal wire length can be formulated as linear programming. It is not only an exact algorithm to minimize wire length and meanwhile keep the minimum area by distributing white space smarter, but also an approach to optimally minimize the composite cost of both area and wire length. The algorithm is so efficient in that it finishes in less than 0.4 seconds for all MCNC benchmarks of block placement. It is also very effective. Experimental results show we can improve 4.2% of wire length even on very compact floorplans. Thus it is worth applying as a step of post-floorplanning (refine floorplanning). It is noted that researchers have studied the problem of allocating white space in placement for various objectives. These methods are heuristics in terms of minimizing wire length. The approach of this invention optimally minimizes wire length for a given floorplan, and can be applicable to mixed-size cell placement.

Most floorplanning algorithms use simulated annealing to search for an optimal floorplan. The implementation of a simulated annealing scheme relies on a floorplan representation where a neighbor solution is generated and examined by perturbing the representation. In the invention, we use sequence pair representation to present the approach. The reason we pick sequence pair is that it is simple and widely adopted. However, our approach is not limited to sequence pair representation. For any floorplan represented by any other presentation, we can derive a constraint graph and, thus, apply the approach to redistribute white space for minimizing total wire length. As discussed below, preferred embodiment of this invention can take any input of floorplan or block placement even with a large set of additional constraints. The optimality of the approach still holds for a given floorplan topology (it does not change topology). The topology can be extracted from a floorplan/block placement, or specified by a representation such as slicing, BSG, sequence pair, TCG, O-tree, B*-tree, CBL, Q-sequence, twin binary tree and twin binary sequence.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

The present invention relates to a method and system to decide the position of circuit blocks or IP blocks on an integrated circuit in order to obtain an optimal wire length. Existing floorplanning algorithms compact blocks to the left and bottom. Although the compaction obtains an optimal area, it may not meet other objectives such as minimizing total wire length.

Figure 1A:
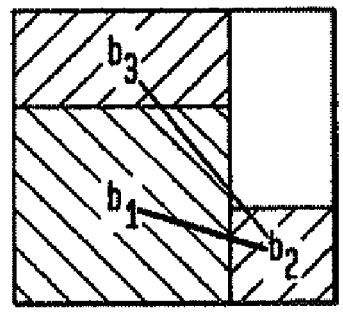
FIG. 1(a) shows a floorplan in which blocks are compacted to the lower-left corner.
Figure 1B:
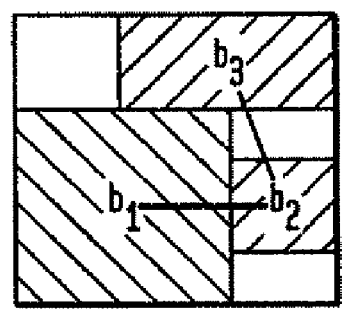
FIG. 1(b) shows an alternate floorplan, with optimal wire length, and which, compared to the floorplan of FIG. 1(a), has the same topology and area but a different distribution of white space.

Even with the same minimum area and the same topology, there exists lots of different floorplans that have different distributions of white space and thus have different values on other objectives. This problem is illustrated in FIGS. 1(a) and 1(b). As can be seen, FIG. 1(b) shows the floorplan with optimal wire length, which has the same topology and area but, compared to FIG. 1(a), has a different distribution of white space.

In accordance with the preferred embodiment of the invention, we first show that the problem of placing the blocks to obtain an optimal wire length can be formulated as linear programming. Then, we find it can be solved by efficient min-cost flow implementation instead of general and slow linear programming. The approach guarantees to obtain the minimum total wire length for a given floorplan topology. We also show that the approach is capable of handling various constraints such as fixed-frame (fixed area), IO pins, pre-placed blocks, boundary blocks, range placement, alignment and abutment, rectilinear blocks, cluster placement, and bounded net delay, without loss of optimality. It is not only an exact algorithm to minimize wire length and meanwhile keep the minimum area by distributing white space smarter, but also an approach to optimally minimize the composite cost of both area and wire length. The algorithm is so efficient in that it finishes in less than 0.4 seconds for all MCNC benchmarks of block placement. It is also very effective. Experimental results show we can improve 4.2% of wire length even on very compact floorplans. Thus it is worth applying as a step of post-floorplanning (refine floorplanning). It is noted that researchers have studied the problem of allocating white space in placement for various objectives. These methods are heuristics in terms of minimizing wire length. The approach of this invention optimally minimizes wire length for a given floorplan, and can be applicable to mixed-size cell placement.

Most floorplanning algorithms use simulated annealing to search for an optimal floorplan. The implementation of a simulated annealing scheme relies on a floorplan representation where a neighbor solution is generated and examined by perturbing the representation. In the invention, we use sequence pair representation to present the approach. The reason we pick sequence pair is that it is simple and widely adopted. However, our approach is not limited to sequence pair representation. For any floorplan represented by any other presentation, we can derive a constraint graph and, thus, apply the approach to redistribute white space for minimizing total wire length. As discussed below, the preferred approach of this invention can take any input of floorplan or block placement even with a large set of additional constraints. The optimality of the approach still holds for a given floorplan topology (it does not change topology). The topology can be extracted from a floorplan/block placement, or specified by a representation such as slicing, BSG, sequence pair, TCG, O-tree, B*-tree, CBL, Q-sequence, twin binary tree and twin binary sequence.

A sequence pair is a pair of sequences of n elements representing a list of n blocks. The two sequences specify the geometric relations (such as left-of, right-of, below, above) between each pair of blocks as follows:

$$(\ldots b_i \ldots b_j \ldots, \ldots b_i \ldots b_j \ldots) \Rightarrow b_i \text{ is to the left of } b_j \quad (1)$$

$$(\ldots b_j \ldots b_i \ldots, \ldots b_i \ldots b_j \ldots) \Rightarrow b_j \text{ is to the left of } b_i \quad (2)$$

Figure 2:
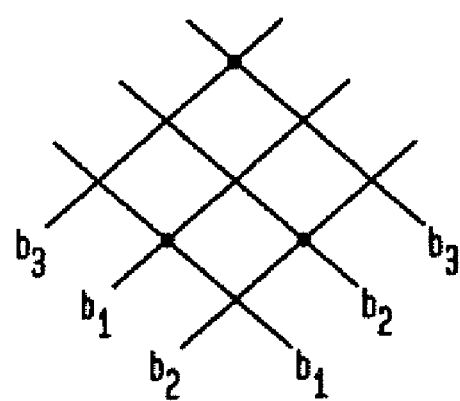
FIG. 2 shows the structure specified by the sequence pair ($b_3$ $b_1$ $b_2$, $b_1$ $b_2$ $b_3$).

The sequence pair structure can be shown as an oblique grid (as shown in FIG. 2). The original paper which proposed sequence pair, "VLSI module placement based on rectangle-packing by the sequence pair", *IEEE Transaction on Computer Aided Design of Integrated Circuits and Systems*, Vol. 15:12, pp. 1518-1524, 1996 (Murata, et al.), presented an algorithm to translate a sequence pair to a placement by constructing two constraint graphs, $G_h$ and $G_v$. Both $G_h$ and $G_v$ have n+2 vertices representing n blocks plus source node and sink node (representing boundaries). $G_h$ has a directed edge ($b_i$, $b_j$) if block $b_i$ is to the left of block $b_j$. Similarly, if block $b_i$ is below block by, G, has the corresponding directed edge ($b_i$, $b_j$). For any pair of blocks (e.g. $b_i$, $b_j$), there exists exactly one edge connecting the two nodes either in $G_h$ or in $G_v$. Both $G_h$ and $G_v$ are vertex weighted, directed, acyclic graphs. The weights in $G_h$ represent the widths of blocks, and the weights in $G_v$ represent the heights of blocks. Given that the coordinates of a block are the coordinates of the lower-left corner of the block, a longest path algorithm can be applied to determine the coordinates of each block and the total width and height of the bounding box. As an example, the sequence pair specifying the placement in FIG. 1 is ($b_3$ $b_1$ $b_2$, $b_1$ $b_2$ $b_3$).

Problem and Solution

Sequence pair specifies the topological relation between blocks. Given a sequence pair, previous algorithm compacts blocks to lower-left corner to minimize area. Even with the same minimum area, there exist different placements of blocks satisfying the topological constraint imposed by the sequence pair. It is very common that white space exists even in the floorplan packed to minimum area. The problem is to find a floorplan that fairly distributes white space and minimizes the total wire length, as defined as follows:

Problem 1. Given a sequence pair (X,Y) with a set of m macro blocks B={$b_1, b_2, \ldots, b_m$} where $w_i \times h_i$ specifies the dimension of block $b_i$ ($w_i$: width, $h_i$: height), and a set of nets N={$N_1, N_2, \ldots, N_n$} where $N_i$, i=1, 2, ..., n describes the connection between blocks, find a placement of blocks B satisfying the topological relation imposed by the sequence pair, such that the total wire length $$\sum_{i=1}^{n} \lambda_i W(N_i)$$

is minimized where $W(N_i)$ denotes the wire length of net $N_i$ and $\lambda_i$ is its weight.

Without loss of practicality, we assume that all $\lambda_i$ are integers. In the following we use $x_i/y_i$ to denote the x/y coordinate of block $b_i$ referring to the lower-left corner of the block. For simple representation and easy understanding, we assume all pins are located in the center of the block. Actually as we can see later, our approach has no restriction that pins should be in the center of the block. It is common to use half perimeter of bounding box as an estimate of wire length for a net. Let us consider a net $N_i$ connecting a set of z blocks {$b_{i_1}, b_{i_2}, \ldots b_{i_z}$}, and use ($L_i, L'_i: R_i, R'_i$) as its bounding box where ($L_i, L'_i$) and ($R_i, R'_i$) refer to lower-left and upper-right corner of the bounding box respectively. Thus we have $\forall j \in \{1, 2, \ldots, z\}$ $$L_i \leq x_{i_j} + w_{i_j}/2 \quad (3)$$

$$R_i \geq x_{i_j} + w_{i_j}/2 \quad (4)$$

$$L'_i \leq y_{i_j} + h_{i_j}/2 \quad (5)$$

$$R'_i \geq y_{i_j} + h_{i_j}/2 \quad (6)$$

Note that the coordinate ($x_{i_j}+w_{i_j}/2, y_{i_j}+h_{i_j}/2$) is the center of the block $b_{i_j}$ where pin is located. When pin is not at the center, we can use the actual pin location to substitute the coordinate. In addition, the geometric constraint imposed by sequence pair can be written as follows:

i. $(\ldots b_i \ldots b_j \ldots, \ldots b_i \ldots b_j \ldots) \Rightarrow x_i + w_i \leq x_j$ (7)

ii. $(\ldots b_i \ldots b_j \ldots, \ldots b_j \ldots b_i \ldots) \Rightarrow y_i + h_i \leq y_i$ (8)

Thus the problem can be stated as:

$$\min \sum_{i=1}^{n} \lambda_i (R_i - L_i + R'_i - L'_i) \quad (9)$$

subject to the set of constraints as stated in (3) (4) (5) (6) (7) (8). Since the evaluation of x and y coordinates can be done independently, the problem can be decoupled into two subproblems:

$$\min \sum_{i=1}^{n} \lambda_i (R_i - L_i) \quad (10)$$

subject to the set of constraints as stated in (3) (4) (7), and $$\min \sum_{i=1}^{n} \lambda_i (R'_i - L'_i) \quad (11)$$

subject to the set of constraints as stated in (5) (6) (8). The problems (10) and (11) can be solved separately. The reason for decoupling is that it makes the algorithm faster. As we can see, all of the three problems, (9), (10) and (11), are linear programming. However, each of the problems has special property that all constraints are difference constraints. Thus its dual problem is a min-cost flow problem, since in the constraint matrix of the dual problem, each column has exactly one "1" and "−1". As we know, linear programming is more general but much slower than min-cost flow algorithm. Let us first consider the problem (10). We can construct a network graph (called horizontal network graph) $G_H=(V_H, E_H)$ as follows.

1. $V_H=\{s,t,x_1,x_2,\ldots,x_m,L_1,R_1,L_2,R_2,\ldots,L_n,R_n\}$ where s is the source node, t is the sink node, $x_i$ represents the x coordinate of block $b_i$, and $L_i$ and $R_i$ represent the left and right boundary of bounding box of net $N_i$ as denoted above.

2. $E_H=\{(s,R_i)|i=1, 2, \ldots, n\} \cup \{(x_i,x_j)|$ block $b_i$ is to the right of block $b_j\} \cup \{R_i,x_j), x_j,L_i)|$net $N_i$ connects block $b_j\} \cup \{(L_i,t)|i=1, 2, \ldots, n\}$, where $(s,R_i)$ is the edge from source to right boundary of bounding box, $(x_i,x_j)$ is the edge imposed by the sequence pair as in constraint (7), $(R_i,x_j)$ is the edge imposed by net connection as in constraint (4), $(x_j,L_i)$ is the edge imposed by net connection as in constraint (3), and $(L_i,t)$ is the edge from left boundary of bounding box to sink.

3. Edge Capacity: $U_H(s,R_i)=U_H(L_i,t)=\forall i \in (1, 2, \ldots, n)$; for any other edge $e \in E_H$, $U_H(e)$ is unlimited.

4. Cost Function: $C_H(s,R_i)=0$, $C_H(L_i,t)=0$, $C_H(x_i,x_j)=-w_j$, $C_H(R_i,x_j)=-w_j/2$, and $C_H(x_j,L_i)=w_j/2$.

It should be noted that the subgraph, which contains only the vertices $x_i$, i=1, 2, ... m and the edges $(x_i,x_j)$ imposed by sequence pair, is similar to the horizontal constraint graph mentioned in Murata, et al. The difference is that the direction of edges is inverted and the edge cost is negative. Thereafter, in Murata, et al. a longest path algorithm is applied to compute the positions of blocks, while in the invention we shall use min-cost flow algorithm in the sense of shortest path. It should also be noted that the transitive edges on the subgraph can be safely omitted, which will speed up the computation considerably.

Thus we compute the min-cost flow of amount $\Sigma_{i=1}^{n} \lambda_i$ on the graph $G_H$, which solves the dual problem. Our goal is to compute the positions of blocks subject to the constraints and minimize the total wire length (the primal problem), which can be done as follows. We first compute the residual graph derived from the min-cost flow. Then a shortest path algorithm applied on the residual graph would give the positions for all blocks. If necessary, a common source node connecting to all other nodes can be added to the residual graph for shortest path computation. Analogously, we can construct another network graph and solve the problem (11) by min-cost flow approach. The graph (called vertical network graph) is denoted as $G_V=(V_V,E_V)$.

We use the example as shown in FIG. 1 to illustrate the approach. The input of the problem is: sequence pair ($b_3$ $b_1$ $b_2$, $b_1$ $b_2$ $b_3$) with 3 blocks, and nets $N_1$={$b_1,b_2$} with weight $\lambda_1=2$, $N_2$={$b_2,b_3$} with weight $\lambda_2=1$. Then the problem (10) to minimize wire length in x dimension can be stated as follows:

$$\min\{2(R_1-L_1)+(R_2-L_2)\}$$

subject to
1. $X_1 4 \leq x_2$
2. $X_1 2 \geq L_1$
3. $X_1 + 2 \leq R_1$

Figure 3A:
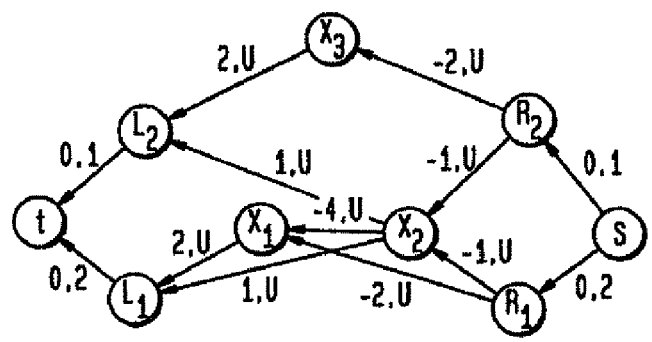
FIG. 3(a) illustrates a horizontal network graph.
Figure 3B:
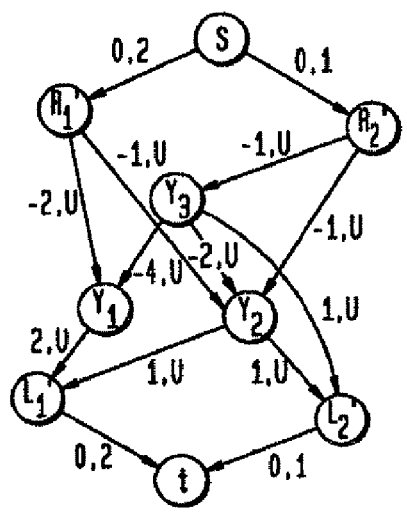
FIG. 3(b) shows a vertical network graph.
Figure 4A:
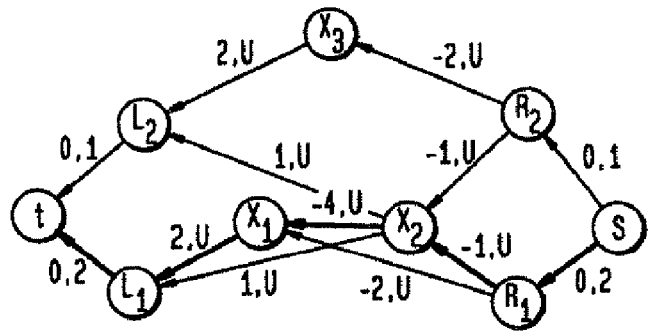
FIG. 4(a) illustrates the results of applying a min-cost flow algorithm on the horizontal network graph of FIG. 3(a).
Figure 4B:
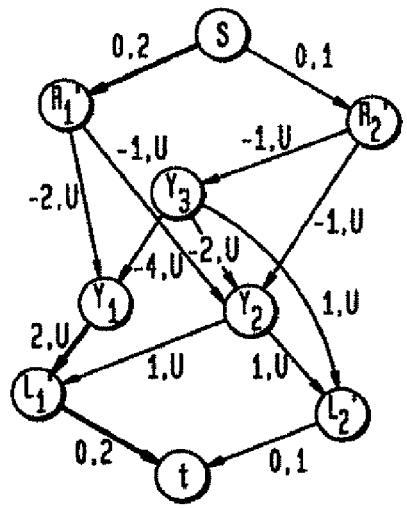
FIG. 4(b) shows the results of applying a min-cost flow algorithm on the vertical network graph of FIG. 3(b).
Figure 5A:
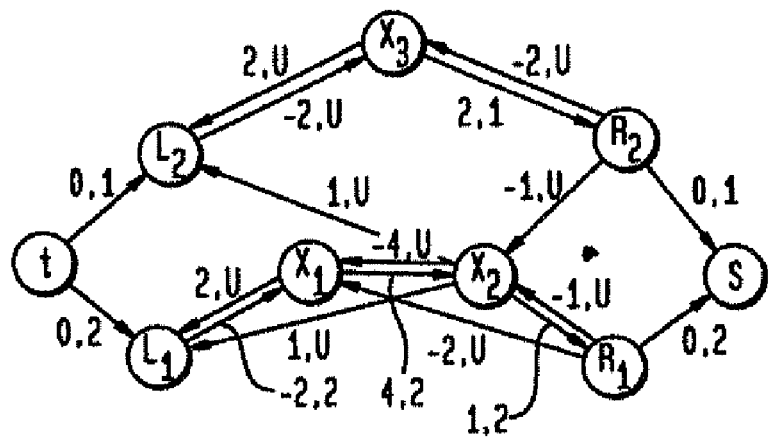
FIGS. 5(a) and 5(b) are residual graphs derived, respectively, from the graphs of FIGS. 4(a) and 4(b).
Figure 5B:
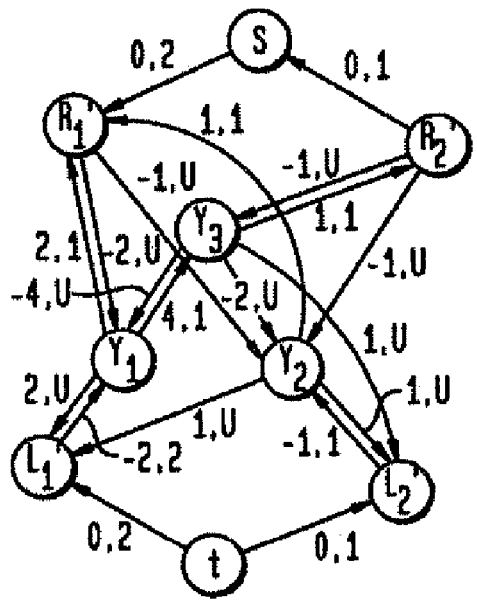

4. $X_2+1 \geq L_1$
5. $X_2+1 \leq R_1$
6. $X_2+1 \geq L_2$
7. $X_2+1 \leq R_2$
8. $X_3+2 \geq L_2$
9. $X_3+2 \leq R_2$ Then this can be transformed to min-cost flow problem in the network graph $G_H$ as shown in FIG. 3(a). Similarly, the problem (11) to minimize wire length in y dimension is transformed to min-cost flow problem in the network graph $G_V$ as shown in FIG. 3(b). Then we compute the min-cost flow of amount: 3 (because $\lambda_1+\lambda_2=3$) on the two graphs, $G_H$ and $G_V$. The results are illustrated in FIG. 4(a) and FIG. 4(b) respectively. Based on the flow results, we derive the residual graphs of $G_H$ and $G_V$, as shown in FIG. 5(a) and FIG. 5(b) respectively. Then we apply shortest path algorithm on the residual graphs to compute the positions of blocks by adding a common source node connecting all other nodes. Thus the results are: $x_1=-5$, $x_2=-1$, $x_3=-2$, $y_1=-5$, $y_2=-4$, and $y_3=-1$. Actually, the results of positions are the node potentials (or called "price"). Many of min-cost algorithms compute both edge flows and node potentials at the same time. Thus in this case, the steps of deriving residual graphs and applying short-path algorithm to compute positions can be skipped.

Figure 6:
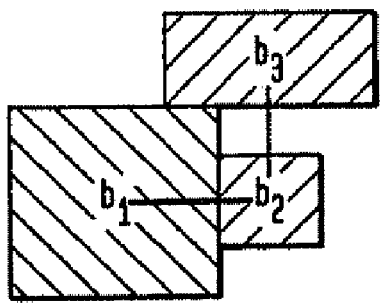
FIG. 6 shows a block placement with minimum wire length.

The placement with minimum wire length is shown in FIG. 6. The overall approach is summarized as follows.

Algorithm Min-Wire
1. Construct the network graphs $G_H$ and $G_V$
2. Apply min-cost flow algorithm on GH and GV
3. Derive the residual graphs of GH and GV
4. Apply shortest path algorithm on residual graphs to compute positions of blocks The complexity of the algorithm, Min-wire, is determined by min-cost flow, since other steps are smaller portions compared to min-cost flow algorithm. Finding a min-cost flow in a network is a classical problem for which several polynomial-time optimal algorithms are available R. K. Ahuja, T. L. Magnanti, and J. B. Orlin. Network Flows, Prentice Hall, 1993. The number of vertices in either $G_H$ or $G_V$ is O(m+n) where m is the number of blocks and n is the number of nets. The number of edges on the subgraph, which contains only the vertices representing blocks and the edges between, is O(m log m) on average[10]. The rest of edges includes the edges introduced by net connections, and the edges incident from/to source/sink. The number of edges incident from source and to sink is O(n). The edges introduced by net connections in the graph are proportional to the number of pins in all nets. Typically in practice, we can assume that the number of pins is a constant on average in a net. Thus the number of edges introduced by net connections is typically O(n). In total, the number of edges is O(m log m+n). Therefore, if we adopt Orlin's algorithm in R. K. Ahuja, T. L. Magnanti, and J. B. Orlin. Network Flows, Prentice Hall, 1993 to compute the min-cost flow, the time complexity of the algorithm Min-wire is typically O(|E|log|V|(|E|+|V|log|V|)) =O((m log m+n) log(m+n) (m log m+n+(m+n)log(m+n))). Practically, we can assume that net weight $\lambda_i$ is O(1) (for example, 1-10), which is true in most applications. We observe that too large weight is unnecessary in actual applications. When net weight is beyond some threshold, it behaves the same in minimizing wire length. Then we can apply successive shortest path augmenting algorithm in computing min-cost flow[3], which is faster in the case. Thus, the complexity is O(nS(m,n)) where S(m,n) denotes the time taken to solve a shortest path problem. If we associate each node with an adjusted weight to eliminate negative cost[3], then S(m,n) is the complexity of Dijkstra algorithm. Finally the complexity is O(n|V|log|V|+|E|))=O(n(m log m+n+(m+n)log(m+n))).

Discussion of Capabilities

It is useful and important in applications that floorplanning handles constraints. As we can see, the approach is capable of handling various constraints without loss of optimality.

Fixed Frame

Figure 7A:
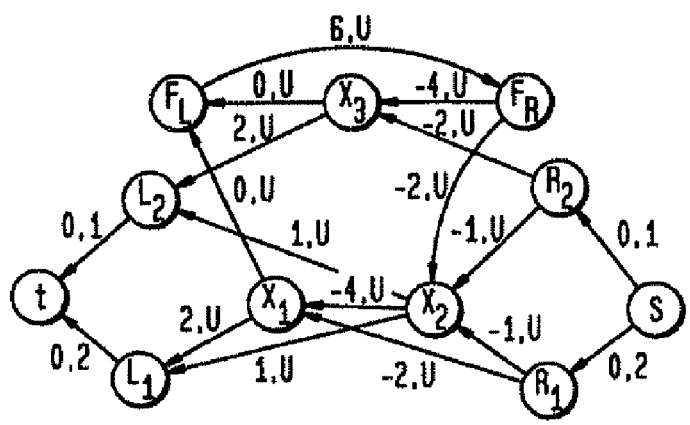
FIGS. 7(a) and 7(b) illustrate modifications of the graphs FIGS. 3(a) and 3(b), respectively, to handle a fixed-frame constraint.
Figure 7B:
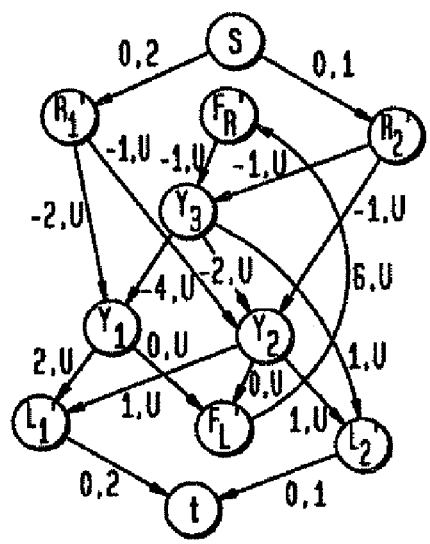

In some applications, floorplanning is confined in a given frame, W×H, where W and H represent width and height respectively. In addition, if we still want to keep the minimum area in minimizing wire length, we can solve the problem with a frame of minimum area. When a frame is taken into account, we modify the graphs as follows. To horizontal network graph $G_H$, two nodes, $f_L$ and $f_R$, are added where $f_L$ and $f_R$ represent the left and right boundary of the frame respectively. We have $x_i+w_i \leq f_R$, $x_1 \geq f_L$ and $f_R-f_L \leq W$. Accordingly, a set of edges are added, ($f_R$, $x_i$) with cost $-w_i$ and unlimited capacity, ($x_i$, $f_L$) with cost 0 and unlimited capacity, i=1, 2, ..., m, and ($f_L$,$f_R$) with cost W and unlimited capacity. Again, the transitive edges in ($f_R$,$x_i$) and ($x_i$,$f_L$) can be omitted. Similarly, two nodes, $f'_L$ and $f'_R$ representing the lower and upper boundary of the frame respectively, and the corresponding edges are added to vertical network graph $G_V$. FIG. 7 illustrates the two modified graphs for the example above. The frame is 6×6 (minimum area). Thus the algorithm Min-wire can still be applied to minimize the total wire length and place blocks in the given frame. Note that the node $f_R$ ($f'_R$) will act as the source node in the step of shortest path computation in $G_H$ ($G_V$) to obtain the positions of blocks. FIG. 1(b) actually gives the optimal placement within the frame.

IO Pin

Usually there exist IO nets which connect to pins on the boundary of the frame (IO pins or IO pads). Let us consider a net $N_i$ connects an IO pin at location ($p_x$,$p_y$). Thus $L_i \leq P_x \leq R_i$ and $L'_i \leq p_y \leq R'_i$. Assume the frame is W×H. Then equivalently, $L_i-f_R \leq p_x-W \leq R_i-fR$ and $L'_i-f'_R \leq p_y-H \leq R'_i-f'_R$. As a result, we add two edges, ($f_R$,$L_i$) (with cost $p_x-W$ and unlimited capacity) and ($R_i$,$f_R$) (with cost $W-p_x$ and unlimited capacity), to graph $G_H$, and add two edges, ($f'_R$,$L'_i$) (with cost $p_y-H$ and unlimited capacity), and ($R'_i$,$f'_R$) (with cost $H-p_y$ and unlimited capacity), to graph $G_V$. Thus the algorithm Min-wire can be applied. In this way, fixed pin can be handled where the pin location may not be on the boundary of the frame.

Preplaced and Boundary Blocks

In the situation where some blocks are to be placed at fixed location or on the boundary of the frame, the algorithm can still apply by adding additional edges to graphs. For example, a block $b_i$ is placed at a location (lx,ly), i.e., $x_i=l_x$ and $y_i$. Thus $x_i-f_R=l_x-W$ and $y_i-f'_R=ly-H$. Equivalently, $x_i,f_R \leq l_x=W$, $x_i-f_R \geq l_x-W, y_i-f'_R \leq l_y-H$, and $y_i-f'_R \geq l_y-H$. These are transformed to edges $f_R,x_i$) and ($x_i,f_R$) on graph $G_H$, and edges ($f'_R$, $y_i$ and ($y_i$, $f'_R$) on graph $G_V$. Boundary blocks can be handled similarly in the sense that boundary blocks fix locations in x or y coordinate.

Range Placement

Range constraint specifies that a block is to be placed within a given range. Pre-placed constraint is a special case of range constraint. Similarly, we can add additional edges to graph $G_H$ and $G_V$ to enforce the computation of position in algorithm Min-wire such that the block is placed within the range.

Alignment and Abutment

Alignment constraint specifies several blocks to be aligned in a row within a range. It can be transformed to a set of difference constraints that keep the relative positions between them. Thus we can add additional edges to the graphs accordingly. Abutment is a special case of alignment.

Rectilinear Block

Rectilinear block is partitioned into a set of rectangular subblocks. Then a set of constraints is used to keep the relative positions, which can be transformed to the additional edges in the graphs accordingly.

Cluster Placement

It is useful in applications that several blocks are placed close to each other (cluster placement). In other words, the distance between any two of the blocks should not be too far away. This can be written as a set of constraints that specify the distance bound between any two of the blocks. Thus we can solve the problem by adding the corresponding edges to the graphs.

Bounded Net Delay

The approach is to minimize the total wire length, which cannot guarantee bounded delay for critical nets. To address bounded net delay, we use a linear function in terms of distance to estimate delay. Although interconnect delay is quadratic in terms of wire length, with appropriate buffer insertions the actual delay is close to linear in terms of source-sink distance. In this way we convert bounded net delay into bounded net wire length. Thus as in X. Tang and D. F. Wong, "Floorplanning with alignment and performance constraints", DAC-02, pp. 848-853, 2002, we impose constraints on the bounding box of the net, which results in the additional edges in the graphs accordingly.

Composite Cost Function

We have discussed fixed-frame constraint that blocks are con-fined within a given frame. Actually, the method is an exact algorithm to optimize the composite cost function of area and wire length:

$$\text{Min}\left\{\alpha(W+H)+\sum_{i=1}^{n}\lambda_i W_i\right\}$$

Note that existing methods can only minimize area, and use compacted blocks' locations to compute the cost of wire length. To optimize the composite cost, we can modify the graphs, $G_H$ and $G_V$, as follows.

Figure 8A:
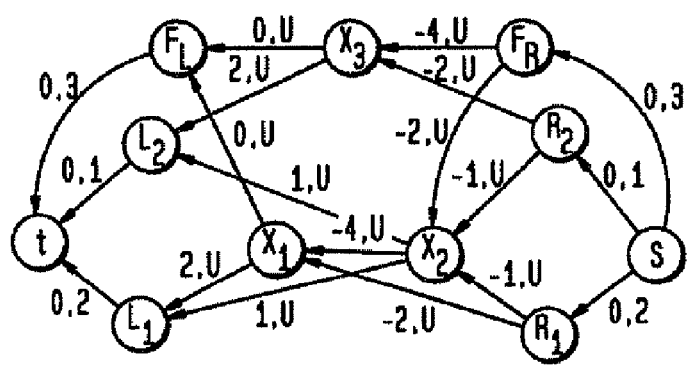
FIGS. 8(a) and 8(b) show modification of the graphs of FIGS. 3(a) and 3(b), respectively, to minimize a composite cost.
Figure 8B:
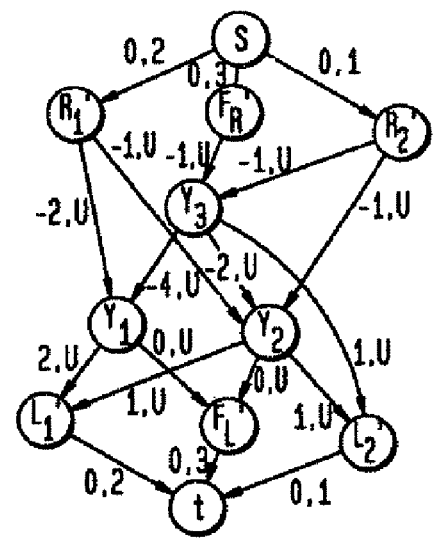

It is similar to the modification that handles fixed-frame constraint, except that there is no edge $(f_L, f_R)$ on graph $G_H$ and no edge $(f'_L, f'_R)$ on graph $G_V$. Instead, we add edges, $(s, f_R)$ with cost 0 and capacity $\alpha$ and $(f_L, t)$ with cost 0 and capacity $\alpha$, to graph $G_H$; and we add edges, $(s, f'_R)$ with cost 0 and capacity $\alpha$ and $(f'_L, t)$ with cost 0 and capacity $\alpha$, to graph $G_V$. FIG. 8 illustrates the two modified graphs for the example above to optimize the composite cost function, where $\alpha=3$. Thus the min-cost flow based algorithm can be used to optimally minimize the composite cost. It should be noted that the amount of flow is $$a+\sum_{i=1}^{n}\lambda_i$$

in the case. We have the following necessary and sufficient condition with respect to all these constraints.

Theorem 2. There exists a feasible placement that satisfies all these constraints if and only if there is no negative cycle in graphs $G_H$ and $G_V$.

When a graph has a negative cycle with unlimited capacity, there does not exist min-cost flow. As we can see, in the graph $G_H$ and $G_V$, the edges except the edges incident from source node or to sink node have unlimited capacity, and the edges incident from source node or to sink node cannot be part of any cycle. Thus any negative cycle will have unlimited capacity. If there is no negative cycle, then the algorithm Min-wire can be used to compute a placement that satisfies all constraints and has the minimum wire length.

Although the condition is similar to that described in "Arbitrary Convex and Concave Rectilinear Block Packing Using Sequence Pair," by K, Fujiyoshi and H. Murata, ISPD-99, pp. 103-100, 1999 (Fujiyoshi, et al.), there exist important differences. (i) The graphs are different. The graph in Fujiyoshi, et al. contains only nodes representing blocks/subblocks. (ii) The approach in Fujiyoshi, et al. operating on its graph thus does area packing only, while our approach can minimize both area and wire length. (iii) Longest path algorithm is used in Fujiyoshi, et al., while longest/shortest path cannot solve our problem and instead main part of our algorithm is min-cost flow.

Applied to Block Placement

Although we take input of sequence pair in the problem definition, the approach can be applied to any floorplan/block placement. Given a floorplan/block placement, we can first extract the topological relation for any pair of blocks and describe as "left of"/"below". For the pair with diagonal relation, we can choose one of "left of"/"below" based on which of the two distances in x/y dimension is longer. Then we can construct the constraint graphs and network graphs. Thereafter, we can apply the approach to minimize wire length.

For the floorplan specified by representation other than sequence pair (such as slicing, BSG, TCG, CBL, Q-sequence, twin binary tree and twin binary sequence), we can also construct constraint graphs, which are equivalent to the topology specified by the representation. Thus the approach can still be applied. Note that the approach does not change the topology. The topology information in O-tree and B*-tree is incomplete (only x-dimension relation is specified and floorplan is obtained by packing). However, we can derive block placement from O-tree and B*-tree and then build constraint graphs from the placement. We summarize the result as follows.

Theorem 3. The algorithm, Min-wire, is optimal in minimizing total wire length for a given floorplan topology. The topology can be extracted from a floorplan/block placement, or specified by any floorplan representation.

Experimental Results

We have implemented the algorithm. Our program can also read an existing floorplan and redistribute white space to optimize wire length. Assuming that $\lambda_i = O(1)$, we use successive shortest path augmenting algorithm in min-cost flow computation.

We have tested the program as a post-floorplanning step with two floorplanner, FAST-SP and Parquet. The test problems are derived from MCNC benchmarks for block placement. We first run FAST-SP or Parquet to obtain a floorplan with option of "minimize wire length". Note that both FAST-SP and Parquet compact blocks to the left and bottom. Then the algorithm Min-wire is applied to further optimize wire length. For all tests, we use the center of block as pin's location, and impose a fixed frame constraint. The locations of IO pins (IO pads) are resized proportionally to the frame boundaries. Table 1 below lists the experimental results for minimizing wire length, where all blocks are hard blocks.

TABLE 1

Results of improving wire length in post-floorplanning of FAST-SP and Parquet.

| | | | FAST-SP | | | | Parquet | | | |
| | | | wire(mm) | | | | wire(mm) | | | |
| circuit | block | net | original | after | improve | time(s) | original | after | improve | time(s) |
| --- | --- | --- | --- | --- | --- | --- | --- | --- | --- | --- |
| aptc | 9 | 97 | 426.7 | 418.9 | 1.8% | 0.02 | 476.3 | 458.0 | 3.8% | 0.03 |
| xerox | 10 | 203 | 486.1 | 462.8 | 4.8% | 0.07 | 581.6 | 550.6 | 5.3% | 0.06 |
| hp | 11 | 83 | 170.0 | 161.5 | 5.0% | 0.02 | 161.1 | 152.4 | 5.4% | 0.02 |
| ami33 | 33 | 123 | 60.0 | 58.0 | 3.3% | 0.03 | 77.2 | 74.1 | 4.0% | 0.03 |
| ami49 | 49 | 408 | 790.1 | 760.2 | 3.8% | 0.38 | 857.8 | 818.9 | 4.5% | 0.36 |

Figure 9A:
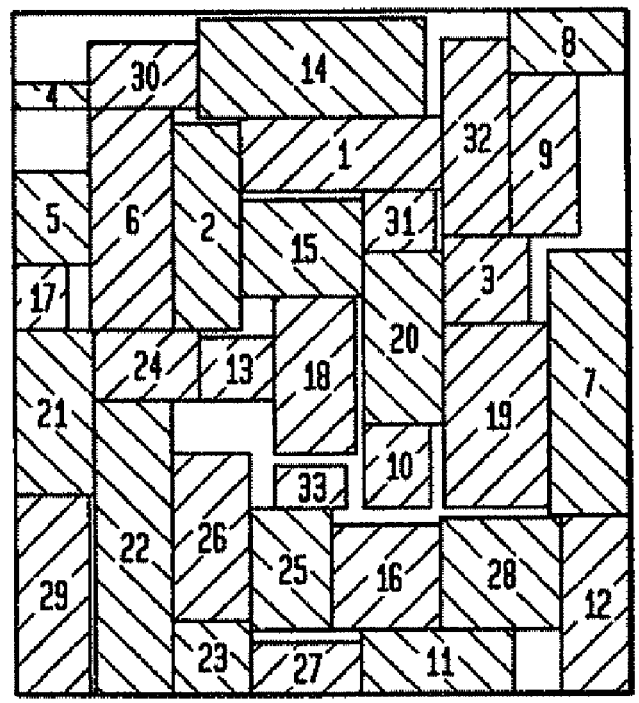
FIG. 9(a) show an original placement of blocks.
Figure 9B:
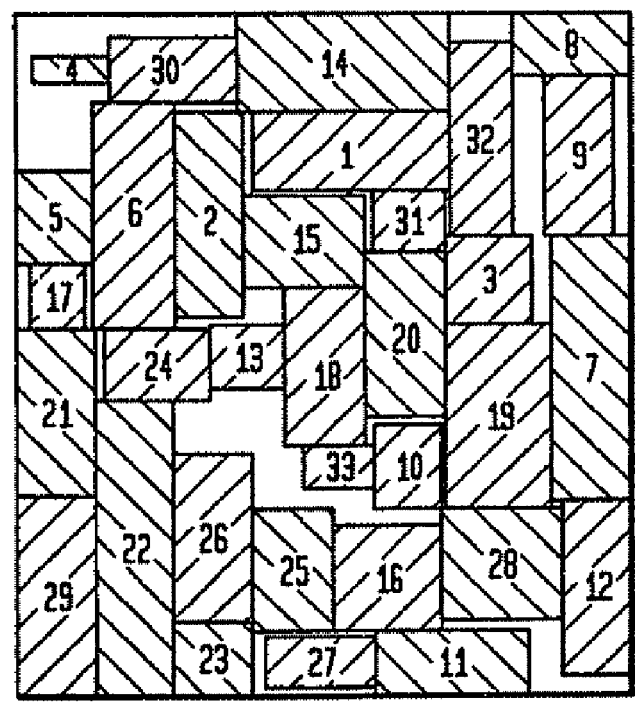
FIG. 9(b) shows the placement of the blocks of FIG. 9(a) when minimizing wire length in the same frame.
Figure 10A:
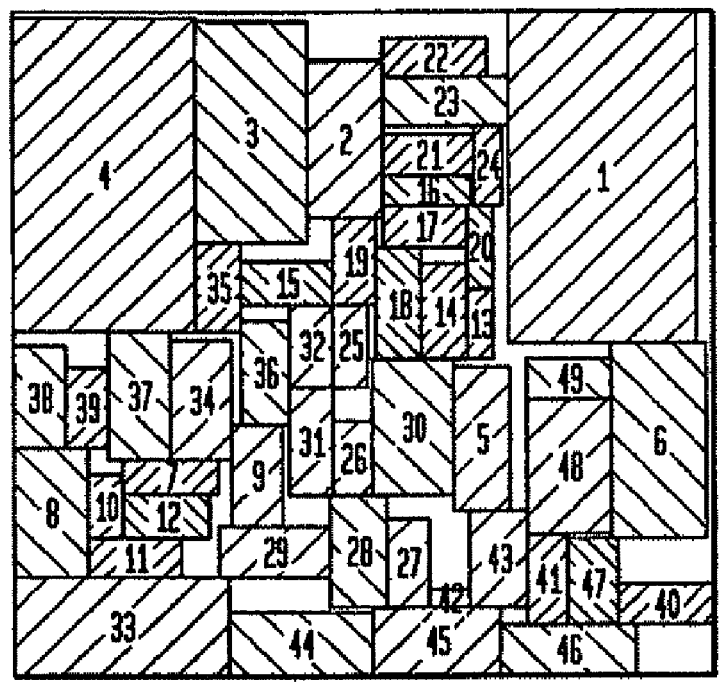
FIG. 10(a) illustrates another original placement of blocks.
Figure 10B:
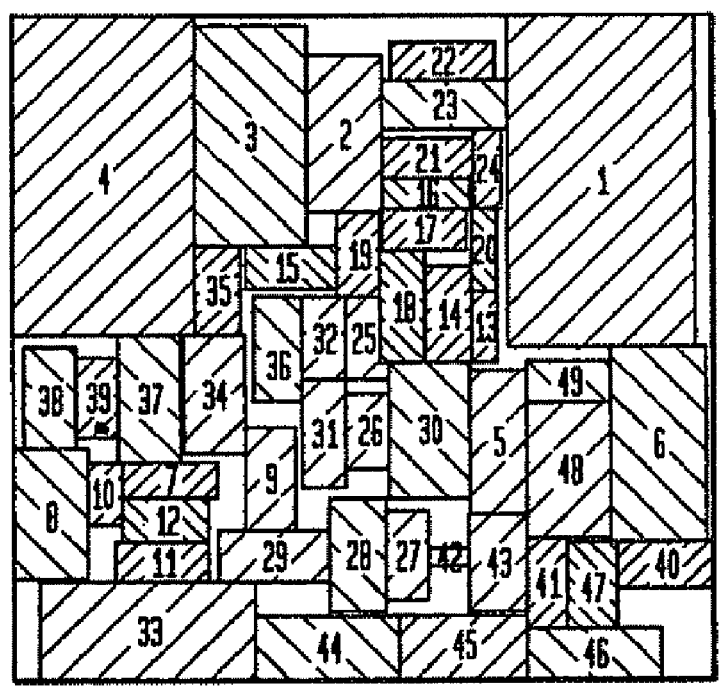
FIG. 10(b) shows a new placement result for the blocks of FIG. (10) when minimizing the wire length in the same frame.

It should be noted that our program does not change floorplan topology and area. Thus area is omitted from the table. The experiments were carried out on a laptop of Pentium 4 Mobile(2.4 Ghz). As we can see, the algorithm is very efficient in that it takes less than 0.4 seconds for all of the benchmarks. It is also very effective in that it can further improve 4.2% of wire length on average even on very compact floorplans. As illustrations, FIGS. 9 and 10 display the placement results of original and after optimization for ami33 and ami49 in FAST-SP respectively.

The invention provides a novel method to distribute white space in floorplanning. The method optimally distributes white space among blocks and guarantees to obtain the minimum total wire length for a given floorplan topology. It is also an exact algorithm to optimize the composite cost function of area and wire length:

$$\min\left\{\alpha(W+H)+\sum_{i=1}^{n}\lambda_i W_i\right\}.$$

We have also shown that the method can handle various constraints such as fixed-frame, IO pins, pre-placed blocks, boundary blocks, range placement, alignment and abutment, rectilinear blocks, cluster placement, and bounded net delay, without loss of optimality. Experimental results show it is very efficient and effective. Thus it provides an ideal way to refine floorplanning post-floorplanning). The future work is to extend the method to consider routing congestion and buffer insertion in floorplanning and to apply it in mixed-cell placement.

As will be understood by those of ordinary skill in the art, the present invention can be realized in hardware, software, or a combination of hardware and software. Any kind of computer/server system(s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized.

The present invention can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

What is claimed is:

1. A method of redistributing white space within an integrated circuit floorplan to realize an efficiently arranged integrated circuit, comprising the steps of:
   providing the integrated circuit floorplan within which are located a plurality of circuit blocks to be efficiently arranged on the integrated circuit;
   determining where to place the circuit blocks on the integrated circuit to obtain a floor plan having minimized white space;
   redistributing the circuit blocks, from the floorplan having minimized white space, to obtain a minimal total wire length and optimized circuit block arrangement for the integrated circuit, including constructing a network graph, computing a residual graph derived from the network graph, and applying a shortest path algorithm on the residual graph to give positions for all of the circuit blocks on the integrated circuit; and
   using a computer system, executing a block redistributing program, to perform the redistributing step.

2. The method according to claim 1, wherein the step of determining includes transforming the integrated circuit floorplan to a floorplan form that is efficient for determining using a linear programming procedure.

3. The method according to claim 1, wherein said minimal total wire length is the minimum total wire length in polynomial time for the integrated circuit floorplan topology.

4. The method according to claim 1, wherein:
   the redistributing step redistributes the circuit blocks within the integrated circuit floorplan subject to a given set of constraints; and
   the given set of constraints include one or more of the following: fixed area, IO pins, pre-placed blocks, boundary blocks, range placement, alignment and abutment, rectilinear blocks, cluster placement, and bounded net delay.

5. The method according to claim 1, wherein the floorplan is represented as a sequence pair comprising a pair of sequences of n elements representing n blocks that specify the geometric relations between each pair of n blocks.

6. The method according to claim 5, wherein the redistributing step includes first deriving a constraint graph from the representation of the integrated circuit floorplan prior to the redistributing to obtain the minimal total wire length and optimized circuit block arrangement.

7. A system for redistributing white space on an integrated circuit floorplan, comprising:
   means for generating the integrated circuit floorplan to include a plurality of circuit blocks;
   means for determining where to rearrange and place the circuit blocks within the integrated circuit floorplan to obtain a floor plan having minimized white space; and
   means for redistributing the circuit blocks, from the floorplan having minimized white space, to generate a redistributed floorplan, wherein the circuit blocks are placed on the integrated circuit in an arrangement to obtain a minimum wire length and optimized circuit block arrangement for the integrated circuit, including constructing a network graph, computing a residual graph derived from the network graph, and applying a shortest path algorithm on the residual graph to give positions for all of the circuit blocks on the integrated circuit.

8. The system according to claim 7, wherein the means for determining implements a linear programming procedure before using the min-cost flow based approach.

9. The system according to claim 7, wherein:
   the means for redistributing operates subject to a given set of constraints which include one or more of the following: fixed area, IO pins, pre-placed blocks, boundary blocks, range placement, alignment and abutment, rectilinear blocks, cluster placement, and bounded net delay.

10. The system according to claim 7, wherein:
   the means for generating provides the integrated circuit floorplan as a sequence pair comprising a pair of sequences of n elements representing n circuit blocks and specifying the geometric relations between each pair of the n circuit blocks.

11. A program storage device readable by machine, tangibly embodying a program of instructions executable by the machine to perform method steps for redistributing white space on an integrated circuit, the method steps comprising:
   providing the integrated circuit floorplan within which are located a plurality of circuit blocks;
   determining where to place the circuit blocks on the integrated circuit to obtain a floor plan having minimized white space; and
   redistributing the circuit blocks, from the floorplan having minimized white space, to obtain a minimal total wire length and optimized circuit block arrangement for the integrated circuit, including constructing network graph, computing a residual graph derived from the network graph, and applying a shortest path algorithm on the residual graph to give positions for all of the circuit blocks on the integrated circuit.

12. The program storage device according to claim 11, wherein the step of determining includes transforming the integrated circuit floorplan to a floorplan form that is efficient for determining using a linear programming procedure.

13. The program according to claim 11, wherein:
   the redistributing step redistributes the circuit blocks within the integrated circuit floorplan subject to a given set of constraints; and
   the given set of constraints include one or more of the following: fixed area, IO pins, pre-placed blocks, boundary blocks, range placement, alignment and abutment, rectilinear blocks, cluster placement, and bounded net delay.

14. The program storage device according to claim 11, wherein:
   the floorplan is represented as a sequence pair comprising a pair of sequences of n elements representing n circuit blocks and specifying the geometric relations between each pair of the n circuit blocks.

\* \* \* \* \*